United States Patent
Li et al.

(10) Patent No.: US 6,329,720 B1
(45) Date of Patent: *Dec. 11, 2001

(54) TUNGSTEN LOCAL INTERCONNECT FOR SILICON INTEGRATED CIRCUIT STRUCTURES, AND METHOD OF MAKING SAME

(75) Inventors: Weidan Li, San Jose; Wen-Chin Yeh, Fremont; Rajat Rakkhit, Milpitas, all of CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/212,450

(22) Filed: Dec. 16, 1998

(51) Int. Cl.[7] .............................. H01L 23/48; H01L 29/76
(52) U.S. Cl. ......................... 257/776; 257/383; 257/767; 257/773
(58) Field of Search ................................... 257/751, 752, 257/753, 758, 760, 763, 767, 770, 773, 774, 776, 382, 383, 384; 438/618, 619, 629, 637, 280, 300

(56) References Cited

U.S. PATENT DOCUMENTS 5,807,779 * 9/1998 Liaw ..................... 438/279

FOREIGN PATENT DOCUMENTS 3-175676 * 7/1991 (JP).

* cited by examiner

*Primary Examiner*—Steven Loke
*Assistant Examiner*—Hung Kim Vu
(74) *Attorney, Agent, or Firm*—John P. Taylor, Esq.

(57) ABSTRACT

A local interconnect for an integrated circuit structure is described capable of bridging over a conductive element to electrically connect together, at the local interconnect level, non-adjacent conductive portions of the integrated circuit structure. After formation of active devices and a conductive element of an integrated circuit structure in a semiconductor substrate, a silicon oxide mask is formed over the structure, with the conductive element covered by the silicon oxide mask. Metal silicide is then formed in exposed silicon regions beneath openings in the mask. The portion of the silicon oxide mask covering the conductive element is then retained as insulation. A silicon nitride etch stop layer and a planarizable dielectric layer are then formed over the structure. An opening is then formed through such silicon nitride and dielectric layers over the conductive element and exposed metal silicide regions adjacent the conductive element. Conductive metal is then deposited over the entire structure to fill the opening. The conductive metal thereby forms a local interconnect which bridges over the conductive element to electrically connect the respective exposed metal silicide regions adjacent the conductive element, with the silicon oxide retained over the conductive element providing insulation to electrically separate the local interconnect from the conductive element. A formula is also provided for calculating the thickness range of the silicon oxide mask layer when a silicon nitride etch stop layer is utilized.

11 Claims, 8 Drawing Sheets

```
┌─────────────────────────────────────────────────────────────┐
│   FORMING ON AN INTEGRATED CIRCUIT STRUCTURE AN ELECTRICALLY │
│   CONDUCTIVE ELEMENT TO BE BRIDGED BY A LOCAL INTERCONNECT   │
└─────────────────────────────────────────────────────────────┘
                              │
┌─────────────────────────────────────────────────────────────┐
│   FORMING SILICON OXIDE INSULATION OVER THE CONDUCTIVE ELEMENT│
│        TO A RANGE OF THICKNESS DETERMINED BY A FORMULA       │
└─────────────────────────────────────────────────────────────┘
                              │
┌─────────────────────────────────────────────────────────────┐
│           FORMING A SILICON NITRIDE LAYER OVER THE           │
│               INTEGRATED CIRCUIT STRUCTURE                   │
└─────────────────────────────────────────────────────────────┘
                              │
┌─────────────────────────────────────────────────────────────┐
│     FORMING A DIELECTRIC LAYER OVER THE SILICON NITRIDE LAYER│
└─────────────────────────────────────────────────────────────┘
                              │
┌─────────────────────────────────────────────────────────────┐
│   REMOVING A PORTION OF THE DIELECTRIC LAYER AND ALSO REMOVING│
│   THE PORTION OF THE UNDERLYING SILICON NITRIDE LAYER EXPOSED│
│            THEREBY TO EXPOSE THE OXIDE INSULATION OVER THE   │
│                      CONDUCTIVE ELEMENT                      │
└─────────────────────────────────────────────────────────────┘
                              │
┌─────────────────────────────────────────────────────────────┐
│     FORMING A LOCAL INTERCONNECT OVER THE EXPOSED OXIDE      │
│   INSULATION TO BRIDGE OVER THE CONDUCTIVE ELEMENT BENEATH THE│
│                      OXIDE INSULATION                        │
└─────────────────────────────────────────────────────────────┘
```

FIG. 19

```
┌─────────────────────────────────────────────────────────────┐
│   FORMING ON AN INTEGRATED CIRCUIT STRUCTURE ONE OR MORE    │
│         ELECTRICALLY CONDUCTIVE REGIONS TO BE BRIDGED       │
│                   BY A LOCAL INTERCONNECT                   │
└─────────────────────────────────────────────────────────────┘
                              │
┌─────────────────────────────────────────────────────────────┐
│   FORMING A SILICON OXIDE INSULATION MASK OVER THE CONDUCTIVE│
│    ELEMENT TO A RANGE OF THICKNESS DETERMINED BY A FORMULA, │
│   WITH OPENINGS IN THE OXIDE INSULATION MASK EXPOSING SILICON│
│   REGIONS OF THE UNDERLYING INTEGRATED CIRCUIT STRUCTURE WHERE│
│   METAL SILICIDE CONTACTS WILL BE FORMED, AND PORTIONS OF THE│
│    REMAINDER OF THE OXIDE INSULATION MASK COVERING THE ONE OR│
│         MORE CONDUCTIVE REGIONS TO BE BRIDGED               │
│                  BY THE LOCAL INTERCONNECT                  │
└─────────────────────────────────────────────────────────────┘
                              │
┌─────────────────────────────────────────────────────────────┐
│   FORMING METAL SILICIDE OVER SILICON PORTIONS OF THE INTEGRATED│
│       CIRCUIT STRUCTURE EXPOSED BY OPENINGS IN THE OXIDE    │
│                      INSULATION MASK                        │
└─────────────────────────────────────────────────────────────┘
                              │
┌─────────────────────────────────────────────────────────────┐
│    FORMING A SILICON NITRIDE LAYER OVER THE INTEGRATED CIRCUIT│
│    STRUCTURE, AND THEN FORMING A DIELECTRIC LAYER OVER THE  │
│                    SILICON NITRIDE LAYER                    │
└─────────────────────────────────────────────────────────────┘
                              │
┌─────────────────────────────────────────────────────────────┐
│   REMOVING A PORTION OF THE DIELECTRIC LAYER AND ALSO REMOVING│
│    THE PORTION OF THE UNDERLYING SILICON NITRIDE LAYER EXPOSED│
│    THEREBY TO EXPOSE THE OXIDE INSULATION MASK OVER THE ONE OR│
│                    MORE CONDUCTIVE REGIONS                  │
└─────────────────────────────────────────────────────────────┘
                              │
┌─────────────────────────────────────────────────────────────┐
│       FORMING A LOCAL INTERCONNECT OVER THE EXPOSED OXIDE   │
│    INSULATION MASK TO BRIDGE OVER THE ONE OR MORE CONDUCTIVE│
│         REGIONS BENEATH THE OXIDE INSULATION MASK           │
└─────────────────────────────────────────────────────────────┘
```

FIG. 20

TUNGSTEN LOCAL INTERCONNECT FOR SILICON INTEGRATED CIRCUIT STRUCTURES, AND METHOD OF MAKING SAME

BACKGROUND OF THE INVENTION

1. Field of the Invention

This invention relates to an integrated circuit structure formed with a local interconnect. More particularly, this invention relates to a silicon integrated circuit structure having a tungsten local interconnect.

2. Description of the Related Art

Conventionally an integrated circuit structure may be constructed with local interconnects formed in between adjacent conductive portions of the integrated circuit devices, such as in between the source/drain electrodes of adjacent MOS transistors. Such local interconnects may be formed using the same conductive material as the filler material, e.g., tungsten, used to fill the contact openings which provide electrical connection to other portions of the integrated circuit structure.

With the shrinking of the minimum feature size of integrated circuit structures, the scaling down of the interconnect becomes important to increase the chip density. Tungsten local interconnect is a technology which allows designers of integrated circuit structures to use the first tungsten contact layer as a circuit routing layer, and thus increase the chip density and routing flexibility. However, conventional tungsten local interconnect technology does not allow the tungsten lines at the contact layer level to go across unrelated polysilicon and diffusion regions. That is, conventional tungsten local lines or "interconnects" cannot bridge over conductive regions, but can only be used to interconnect adjacent conductive regions separated by an insulator, and therefore, are conventionally referred to as "local" interconnects. This represents a significant limitation to the use of tungsten interconnect technology as a circuit routing layer.

In copending Pasch et al. U.S. patent application Ser. No. 09/081,403, filed by one of us with another on May 18, 1998, and assigned to the assignee of this invention, and the incorporation of which herein by reference is hereby made, a structure is described and claimed to overcome this problem. A plurality of dielectric layers is provided with the lowest dielectric layer formed over the underlying integrated circuit structure to a height or thickness as high as, or preferably exceeding, the height of the highest conductive regions of the underlying integrated circuit devices; a second dielectric layer is formed above the first dielectric layer with one or more local interconnects formed in this second dielectric layer; and then a thin third dielectric layer is formed over the second dielectric layer and the local interconnects therein. The first layer of metal interconnects is then formed over the thin third dielectric layer.

SUMMARY OF THE INVENTION

The invention comprises an integrated circuit structure and method of making same wherein a local interconnect may be formed, for example, from the same material used to fill contact openings, and the local interconnect is capable of bridging over a conductive element in the integrated circuit structure to electrically connect together, at the local interconnect level, non-adjacent conductive portions of the integrated circuit structure. After formation of active devices and a conductive element of an integrated circuit structure in a semiconductor substrate, a silicon oxide mask is formed over the structure, including the conductive element, with openings provided in the mask corresponding to silicon regions where metal silicide is to be formed. Metal silicide is then formed through the openings in the silicon oxide mask over and in the exposed silicon regions. At least the portion of the silicon oxide mask layer over the conductive element is then retained as insulation on the structure after the silicide formation step. A silicon nitride etch stop layer and a planarizable dielectric layer are then formed over the entire structure and planarized. One or more openings are then formed through such further layers conforming to regions where contact openings and one or more local interconnects are to be formed, including an opening in the silicon nitride and dielectric layers over the conductive element and exposed metal silicide regions adjacent the conductive element. One or more layers of conductive metal are then deposited over the entire structure to fill the contact openings and the local interconnect opening. The conductive metal is then planarized with the surface of the planarizable dielectric layer to form a local interconnect which bridges over the conductive element to electrically connect the exposed metal silicide regions adjacent the conductive element, with the portion of the silicon oxide mask retained over the conductive element providing insulation to electrically separate the local interconnect from the conductive element. A formula is also provided for calculating the thickness range of the silicon oxide mask layer when a silicon nitride etch stop layer is utilized.

A further dielectric layer is then formed and planarized over the planarizable dielectric layer with vias formed through this further dielectric layer to the filled contact openings and local interconnects in the planarizable dielectric layer. A patterned metal interconnect layer is then formed over this further dielectric layer and in registry with the filled vias in the further dielectric layer.

In another embodiment, wherein the conductive element is also silicon and the formation of metal silicide on the conductive element is also desired, e.g., to reduce the resistance of the conductive element, the metal silicide is formed prior to formation of the silicon oxide mask layer over the conductive element. The silicon oxide mask layer is then formed over the silicided conductive element, and the remainder of the process is then carried out as previously described.

BRIEF DESCRIPTION OF THE DRAWINGS

FIG. 19 is a flow sheet illustrating the process of one embodiment of the invention.

FIG. 20 is a flow sheet illustrating the process of another embodiment of the invention.

DETAILED DESCRIPTION OF THE INVENTION

The invention comprises an integrated circuit structure and method of making same wherein a local interconnect may be formed, for example, from the same material used to fill contact openings, and the local interconnect is capable of bridging over one or more conductive elements in the integrated circuit structure to electrically connect together, at the local interconnect level, non-adjacent conductive portions of the integrated circuit structure.

By use of the term "local interconnect" herein is meant an interconnect usually formed just above the integrated circuit substrate and in direct electrical contact with one or more active devices in the substrate; as opposed to the term "metal interconnect" which refers to an interconnect usually separated from the substrate by an insulation layer and electrically connected to underlying active devices in the substrate through filled contact openings vertically formed through the underlying insulation layer.

Figure 1:
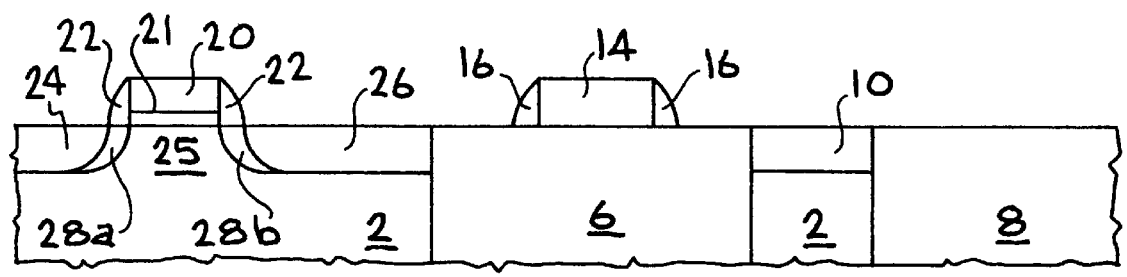
FIG. 1 is a fragmentary vertical cross-sectional view of an integrated circuit structure comprising an MOS transistor and a polysilicon line formed over an insulation trench.

Turning now to FIGS. 1–10, a preferred embodiment of the integrated circuit structure of the invention, and method of making same, will now be described. FIG. 1 shows a typical integrated circuit structure to which the invention may apply. A silicon semiconductor substrate 2 is shown in which isolation trenches 6 and 8 (also referred to herein as shallow trench isolation or STI) have been previously formed and filled with an insulation material such as silicon oxide. It should be noted, in this regard, that any and all of the structures shown in, and described for, FIG. 1 as having been constructed in silicon substrate 2, may have been constructed in or adjacent a P doped well or N doped well in substrate 2, and the references to substrate 2 herein should be deemed to include both the substrate itself and also any doped well already formed in substrate 2 prior to the formation of the structures to be described. It should also be noted that while isolation trenches 6 and 8 are described and illustrated, the use of field oxide isolation regions in the substrate, instead of insulation-filled trenches, are within the scope of the invention.

Between isolation trenches 6 and 8 is shown a diffusion or doped region 10 formed in silicon substrate 2 which might, for example, serve as a tap (electrical contact) to substrate 2, or to a well (not shown) in substrate 2. Formed on the upper surface of isolation trench 6 is a polysilicon conductive element 14 having sidewall silicon oxide spacers 16 formed on the sides thereof. Polysilicon conductive element 14 might be appropriately doped to serve as a polysilicon resistor or a gate electrode, or it could serve as a conductive line or bus.

To the left of isolation trench 6 is shown an MOS transistor formed in/on substrate 2, comprising a polysilicon gate electrode 20, formed over a gate oxide layer 21, and having silicon nitride or silicon oxide sidewall spacers 22 on the gate electrode sidewalls; source/drain regions 24 and 26; and lightly doped drain (LDD) regions 28a and 28b separating source/drain regions 24 and 26 from channel region 25 of the MOS transistor, which channel region is formed in substrate 2 beneath gate oxide 21.

Figure 2:
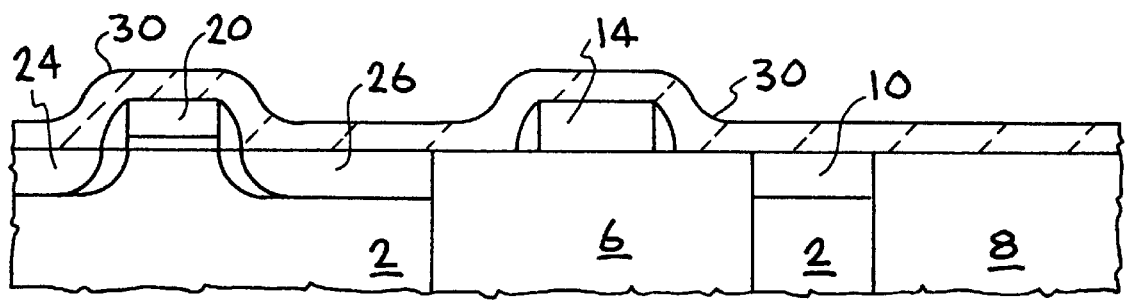
FIG. 2 is a fragmentary vertical cross-sectional view of the structure of FIG. 1 with an oxide mask layer formed over the structure.
Figure 3:
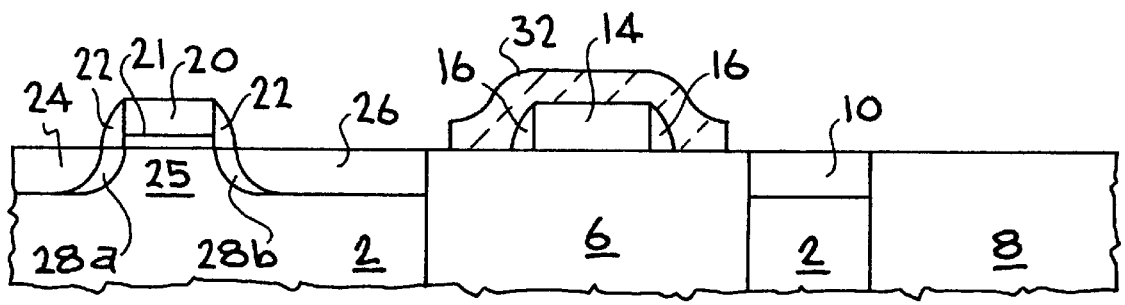
FIG. 3 is a fragmentary vertical cross-sectional view of the structure of FIG. 2 with the oxide mask layer patterned, leaving an oxide layer portion over the polysilicon line.

In accordance with the invention, over the structure of FIG. 1 is blanket deposited a thin dielectric layer 30, as shown in FIG. 2, which will serve as a mask layer during formation of metal silicide contacts to the MOS structure and the diffusion region. In a preferred embodiment, dielectric mask layer 30 will comprise a silicon oxide ($SiO_2$) layer, for a reason to be described below, and dielectric mask layer 30 will, therefore, be hereinafter referred to as oxide mask layer 30. Openings are then formed in oxide mask layer 30, leaving an oxide portion 32 formed over polysilicon conductive element 14, nitride or oxide spacers 16, and at least a portion of the upper surface of isolation trench 6, as shown in FIG. 3.

Figure 4:
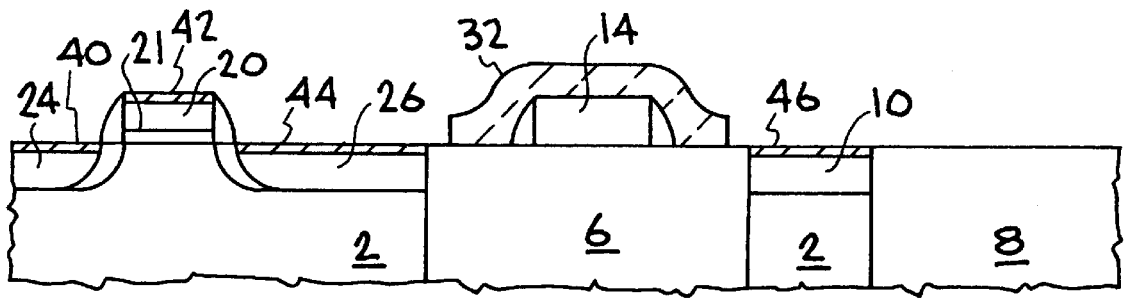
FIG. 4 is a fragmentary vertical cross-sectional view of the structure of FIG. 3 with metal silicide shown formed over exposed silicon portions of the structure.

A layer of a metal capable of reacting with silicon to form a metal silicide is then blanket deposited over the entire structure and heated to a temperature and for a time period sufficient to cause the metal to react with silicon exposed through openings in oxide mask layer 30 to form metal silicide over such exposed silicon in the structure. As shown in FIG. 4, this includes formation of metal silicide contacts 40 and 44, respectively formed over silicon source/drain regions 24 and 26 in silicon substrate 2, metal silicide contact 42 formed over polysilicon gate electrode 20, and metal silicide contact 46 formed over diffusion region 10 in silicon substrate 2. As shown in FIG. 4, no metal silicide is formed over oxide surfaces, i.e., over the respective surfaces of oxide spacers 22, the exposed portion of isolation trench 6, oxide mask portion 32, and isolation trench 8 (due to the absence of silicon available to react with the silicide-forming metal). Any unreacted metal is then removed after the silicide formation step, leaving the structure shown in FIG. 4.

Figure 5:
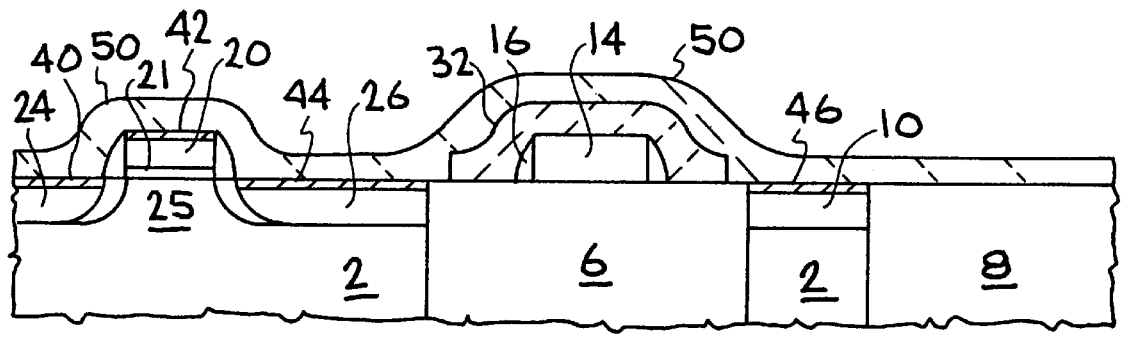
FIG. 5 is a fragmentary vertical cross-sectional view of the structure of FIG. 4 showing a conformal silicon nitride layer blanket deposited over the structure.

Turning now to FIG. 5, a blanket deposition of an etch stop dielectric layer 50, preferably silicon nitride, is illustrated. Silicon nitride layer 50 will act as an etch stop for the etching of a subsequently formed silicon oxide layer, as will be described below. The thickness of silicon nitride layer 50 must, therefore, be sufficient to adequately protect underlying oxide such as oxide portion 32 over polysilicon conductive element 14. However, since portions of silicon nitride layer 50 will also be subsequently removed to permit formation of the local interconnect, an excessive thickness is also not desired. Preferably the thickness of silicon nitride layer 50 will range from about 30 nanometers (nm) to about 100 nm, and most preferably from about 50 nm to about 70 nm.

Figure 6:
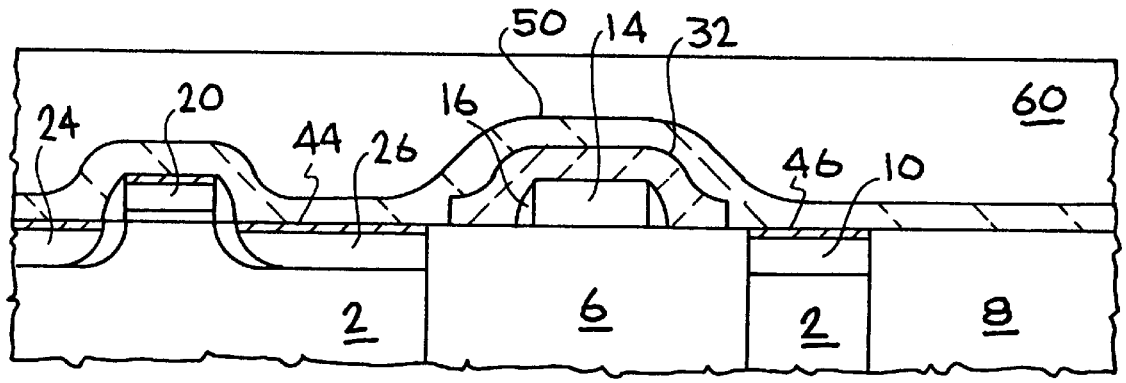
FIG. 6 is a fragmentary vertical cross-sectional view of the structure of FIG. 5 showing a planarized insulation layer formed over the silicon nitride layer.

A dielectric layer 60 is then blanket deposited over the structure of FIG. 5 and then planarized, as shown in FIG. 6. Dielectric layer 60 comprises a dielectric material selectively etchable with respect to etch stop dielectric layer 50 to thereby permit etch stop dielectric layer 50 to function as an etch stop during etching of dielectric layer 60. When etch stop layer 50 comprises silicon nitride, dielectric layer 60 will preferably comprise a silicon oxide layer and most preferably may comprise a deposited glass layer of doped silicon oxide such as phosphorus doped silicon glass (PSG), or a boron and phosphorus doped silicon glass (BPSG). The thickness of dielectric layer 60 should be sufficient to provide a satisfactory electrical insulation between the highest point of the integrated circuit substrate beneath the planarized surface of dielectric layer 60 and any conductive elements formed on the surface of dielectric layer 60. Typically, the thickness of planarized dielectric layer 60 over the highest point of the integrated circuit structure beneath dielectric layer 60 should be at least about 0.1 micrometer ($\mu$m), and preferably at least about 0.4 $\mu$m. A thicker dimension for dielectric layer 60 may be used, but is deemed unnecessary, and may adversely effect the subsequent etching step to remove a portion of dielectric layer 60 to form the local interconnect of the invention.

Figure 7:
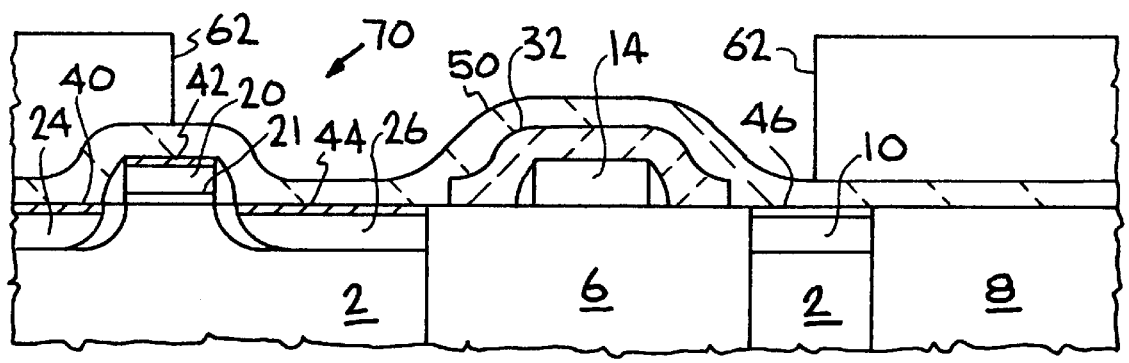
FIG. 7 is a fragmentary vertical cross-sectional view of the structure of FIG. 6 with an opening conforming to the lateral dimensions of the desired local interconnect formed in the insulation layer.
Figure 8:
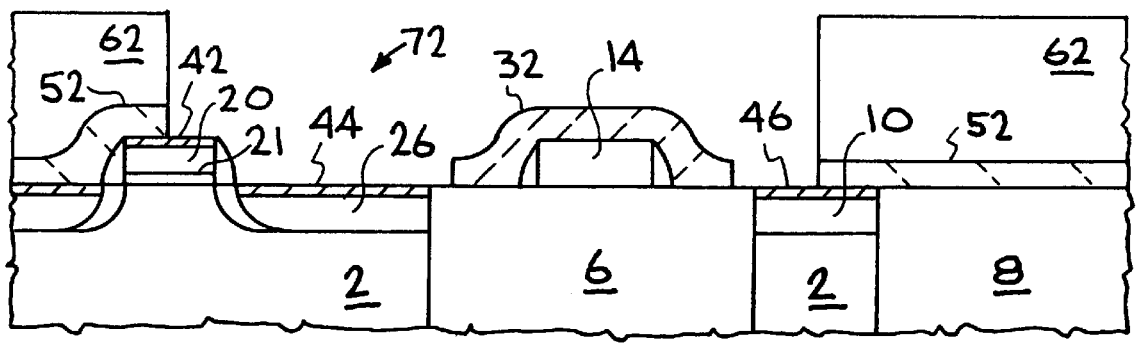
FIG. 8 is a fragmentary vertical cross-sectional view of the structure of FIG. 7 showing an opening cut through the silicon nitride layer conforming to the lateral dimensions of the desired local interconnect.

As shown in FIG. 7, dielectric layer 60 is then masked and etched to form an opening 70 in dielectric layer 60, leaving unetched portions 62. When dielectric layer 60 comprises a silicon oxide material, it may be etched with a silicon oxide etchant system selective to silicon nitride (i.e., an etchant system which will etch silicon oxide in preference to silicon nitride) such as, for example, a CO, $CF_4$, and $C_4F_8$ etch system, using silicon nitride layer 50 as the etch stop. The portion of silicon nitride layer 50 exposed by the just described etching of dielectric layer 60 is then carefully removed by a silicon nitride etch system selective to silicon oxide, such as, for example, a $CHF_3$ and $O_2$ etch system. The result is the formation of opening 72 as shown in FIG. 8, wherein metal silicide contacts 42, 44, and 46 are all exposed.

Figure 9:
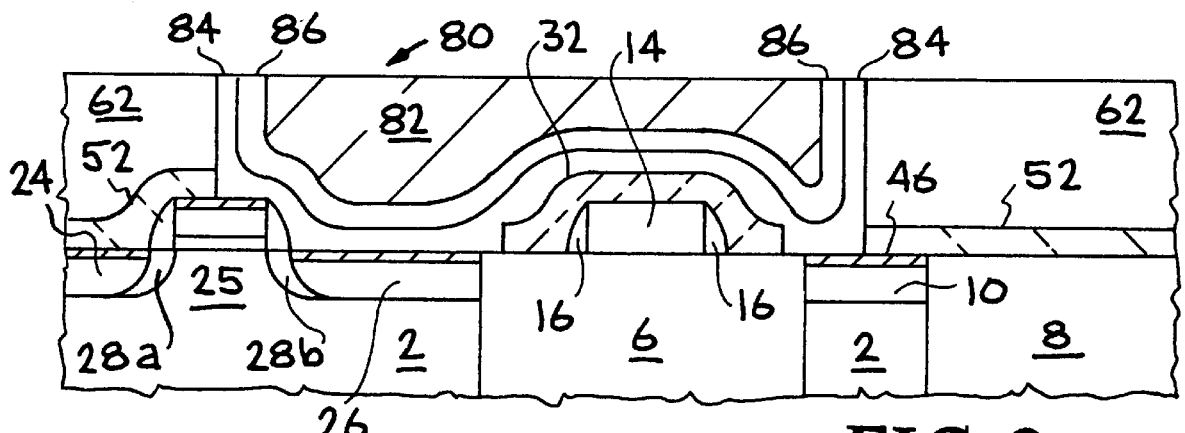
FIG. 9 is a fragmentary vertical cross-sectional view of the structure of FIG. 8 showing the local interconnect formed on the structure.

Opening 72 is then filled with conductive material, in accordance with the invention, to form local interconnect 80 of the invention, as shown in FIG. 9. FIG. 9 illustrates a main conductive filler material 82 used to fill opening 72, such as a tungsten filler material, with a thin first metal barrier layer 84 such as titanium metal deposited in opening 72, followed by deposition of a further barrier layer 86, such as titanium nitride, before deposition of the main tungsten filler material 82. The thicknesses of the respective titanium barrier layer 84 and titanium nitride barrier layer 86 may each range from about 20 nm to about 50 nm. A thickness less than this minimum thickness may be insufficient to provide the desired barrier, while excessive thicknesses of the barrier layers will negatively impact on the amount of tungsten filler material which can be used to fill opening 72. It should be noted that filler material 82 could be formed from a material other than tungsten such as, for example copper or aluminum.

Thus, the local interconnect 80 of the invention can be used, as shown in FIG. 9, to interconnect metal silicide contact 42 on gate electrode 20, and metal silicide contact 44 on source/drain region 26 with metal silicide contact 46 on diffusion region 10, while bridging over polysilicon conductive element 14, due to the presence of oxide mask portion 32. In this embodiment, oxide mask layer 30 is used as a silicide mask during the formation of the metal silicide contacts, so the formation of oxide mask portion 32, during the patterning of oxide mask layer 30, does not involve any extra steps.

Figure 9A:
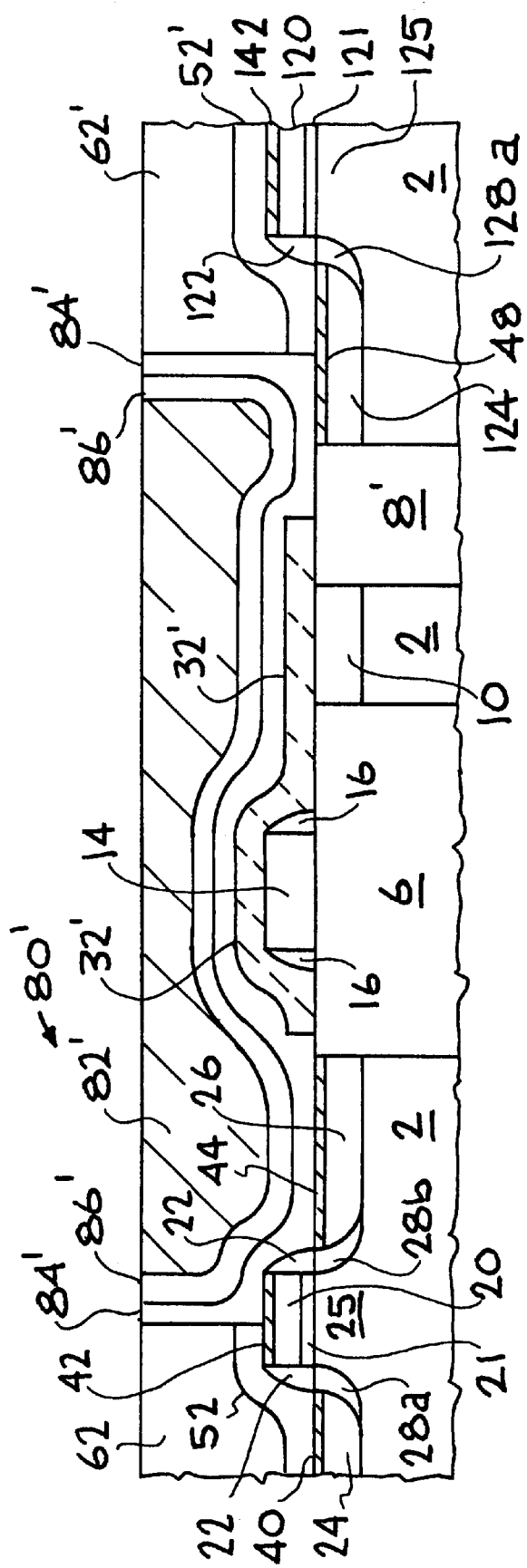
FIG. 9A is a fragmentary vertical cross-sectional view of a modification of the FIG. 9 structure, showing the local interconnect bridging over the polysilicon line and a nearby diffusion area to thereby interconnect a source/drain region of one MOS device with a source/drain region of another MOS device.

FIG. 9A shows a variation on the structure shown in FIG. 9. In this instance local interconnect 80' bridges over both conductive element 14 and diffusion region 10 to interconnect metal silicide contact 42 on gate electrode 20, and metal silicide contact 44 on source/drain region 26 with metal silicide contact 48 on source/drain region 124 of a second MOS transistor separated from diffusion region 10 by isolation trench 8'. This local interconnect formation is made possible by the extension of oxide layer portion 32' to cover not only conductive element 14, but diffusion region 10 as well. The portion of the second transistor shown in FIG. 9A includes LDD region 128a, gate electrode 120 with oxide sidewall spacer 122, metal silicide gate electrode contact 142, gate oxide 121 and channel region 125. Similar to the previous embodiment, dielectric layer 60 and silicon nitride layer 50 are each selectively etched, leaving portions 62 and 62' of layer 60, and portions 52 and 52' of layer 50, to thereby provide an opening for formation of local interconnect 80' which is shown filled with barrier layers 84' and 86' and metal filler material 82'.

In the above described structure and process of the invention, it will be apparent that the thickness of oxide mask layer 30, and more importantly, the thickness of remaining oxide portions 32 or 32', is very important to the practice of this invention. If oxide mask layer 30 is too thin, it may not provide the desired mask protection of, for example, polysilicon conductive element 14 during the silicide step, nor may remaining oxide portion 32 subsequently provide the necessary amount of electrical isolation and insulation between the underlying conductive materials such as, for example, polysilicon conductive element 14 (or diffusion region 10 as well in FIG. 9A) and local interconnect 80 of the invention formed over oxide portion 32. On the other hand, if oxide layer 30 (and oxide portion 32) is too thick, this could increase the amount of shallow trench isolation (or field oxide) lost during etching of oxide layer 30.

Therefore, in accordance with a preferred embodiment of the invention, the range of thickness d of oxide layer 30 should be governed by the following formula:

$$(t_{SiN\ overetch} \times r_{SiN\ strip} \times \alpha) + d_{min} \leq d \leq (d_{STI\ loss}/\beta)$$

Where:

$t_{SiN\ overetch}$=time (seconds) of SiN overetch (time of oxide layer exposure to SiN etch);

$r_{SiN\ strip}$=etch rate of SiN for a particular etchant (nm/sec);

$\alpha$=ratio of SiN to $SiO_2$ selectivity of SiN etchant;

$d_{min}$=minimum thickness (nm) of oxide layer needed for oxide layer to function satisfactorily as electrical insulator;

$d_{STI\ loss}$=thickness (nm) of shallow trench isolation (STI) lost during etching of oxide layer;

$\beta$=etch ratio comprising amount of overetch divided by thickness of oxide layer.

For example, in the above formula, assume that $t_{SiN\ overetch}$, the time of SiN overetch (time of oxide layer exposure to SiN etch), is 5 seconds; $r_{SiN\ strip}$, the etch rate of SiN is 2.5 nm/sec; $\alpha$, the ratio of SiN to $SiO_2$ selectivity, is 0.1; $d_{min}$, the minimum thickness of oxide layer to function satisfactorily as an electrical insulator, is 10 nm, $d_{STI\ loss}$, the thickness of shallow trench isolation (STI) lost during etching of the oxide layer, is 8 nm; and $\beta$, the etch ratio of SiN overetch to oxide layer thickness, is 0.2; then:

(5 sec×2.5 nm/sec×0.1)+10 nm=11.25 nm; and 8 nm/0.2=40 nm;

Thus, using the above formula, d, the thickness of the oxide layer, must be equal to or greater than 11.25 nm (112.5 Angstroms), and less then or equal to 40 nm (400 Angstroms), i.e., oxide layer 30 (and oxide portion 32) may range between 11.25 nm and 40 nm in thickness for the given parameter values. Typically, the thickness of oxide layer 30 will be maintained within a range of from about 20 nm to about 30 nm.

Figure 10:
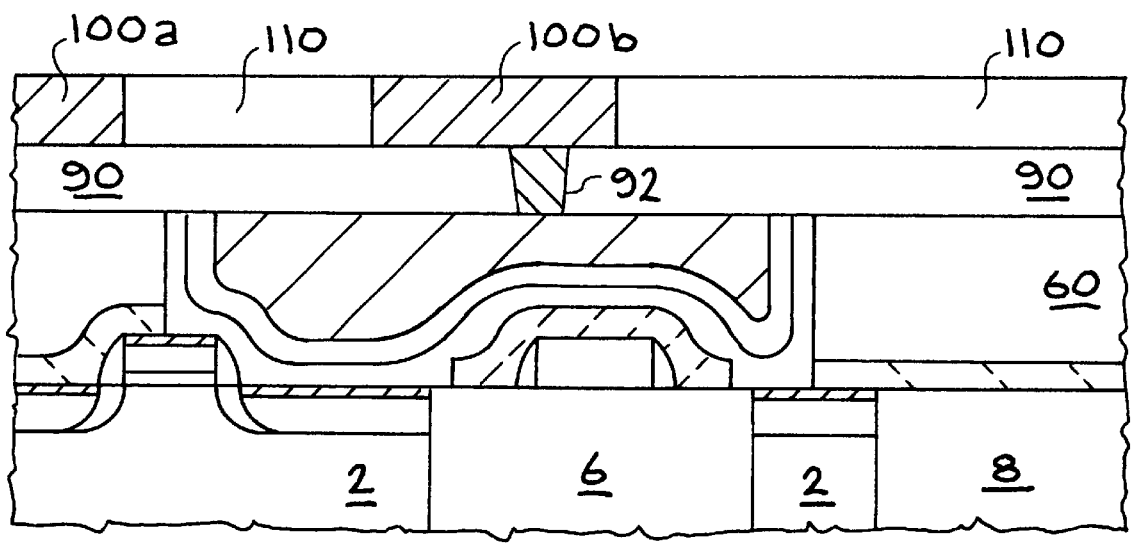
FIG. 10 is a fragmentary vertical cross-sectional view of the structure of FIG. 9 showing a second planarized dielectric layer formed over the first planarized dielectric layer and a metal interconnect formed over the second dielectric layer and in registry with a via through the second dielectric layer to the local interconnect.

Turning now to FIG. 10, the structure of FIG. 9 is shown with a second dielectric layer 90 formed over portions 62 of dielectric layer 60 and local interconnect 80. Vias such as shown at 92 are etched in second dielectric layer 90 in registry with underlying conductive members (such as local interconnect 80), and filled with conductive material, and metal interconnect portions 100a and 100b are then formed over second dielectric layer 90. Metal interconnect portions 100a and 100b may be formed in the illustrated structure of FIG. 10 either by blanket deposition of a metal layer followed by patterning of the metal layer and subsequent deposition and planarization of third dielectric layer 110; or third dielectric layer 110 may be formed and patterned over local interconnect 80 and second dielectric layer 90 first, followed by deposition and planarization of a metal layer into the openings in third dielectric layer 110 resulting in formation of metal interconnect portions 100a and 100b in third dielectric layer 110.

Figure 11:
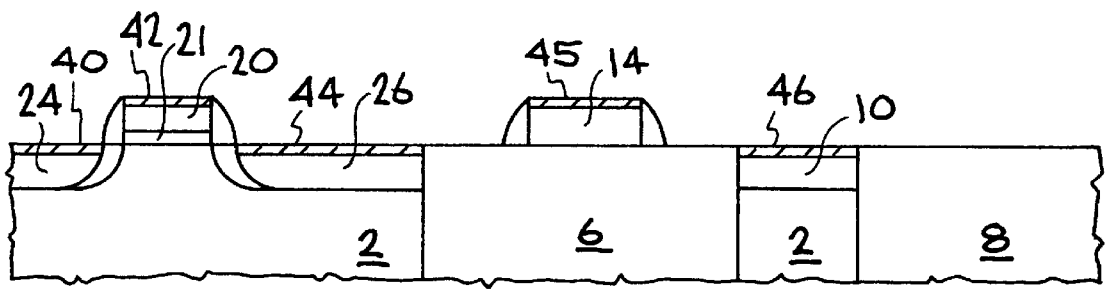
FIG. 11 is a fragmentary vertical cross-sectional view of the structure of FIG. 1 with metal silicide formed over all exposed silicon portions of the structure, including the polysilicon line.

While the foregoing description represent the preferred embodiment of the practice of the invention, it is recognized that there will be instances wherein, for example, it is desired that polysilicon conductive element 14 of the above-described structure function as a conductive line rather than as a resistor. In such instance, it may be desirable to form a metal silicide layer on/in the surface of polysilicon conductive element 14 at the same time as the formation of metal silicide contacts 40, 42, 44, and 46 to thereby enhance the conductivity of polysilicon conductive element 14. The embodiment shown in FIGS. 11–18 (wherein like elements are shown with like numerals) illustrates this. As seen in FIG. 11, the metal silicide formation step has been carried out prior to the blanket deposition of oxide layer 30 over the structure and the patterning of oxide layer 30 to form oxide portion 32 over polysilicon conductive element 14.

Figure 12:
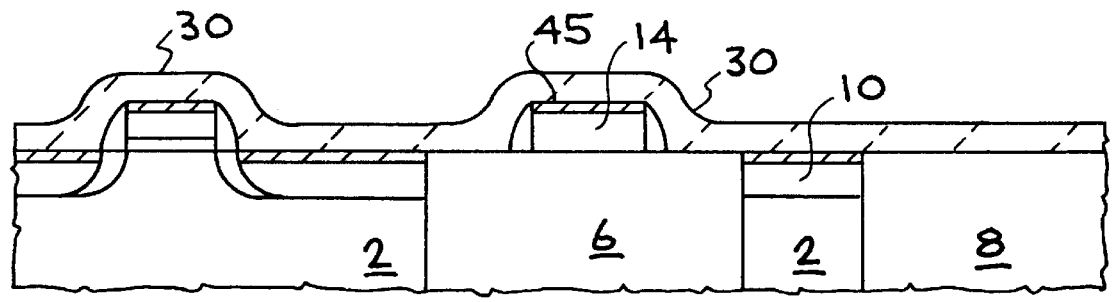
FIG. 12 is a fragmentary vertical cross-sectional view of the structure of FIG. 11 after deposition of the oxide mask layer over the structure.
Figure 13:
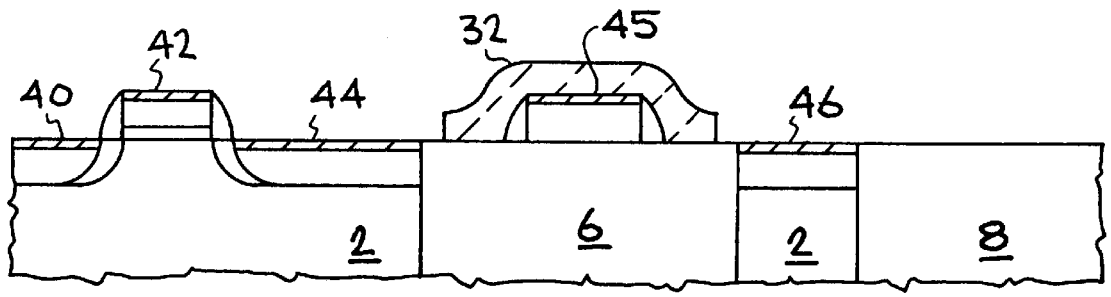
FIG. 13 is a fragmentary vertical cross-sectional view of the structure of FIG. 12 after the oxide mask layer has been patterned, leaving an oxide layer portion over the silicided polysilicon line.
Figure 14:
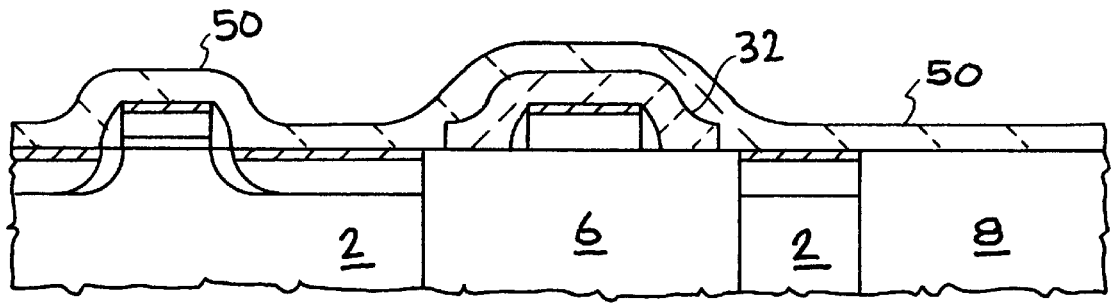
FIG. 14 is a fragmentary vertical cross-sectional view of the structure of FIG. 13 after formation of a conformal silicon nitride layer blanket deposited over the structure.
Figure 15:
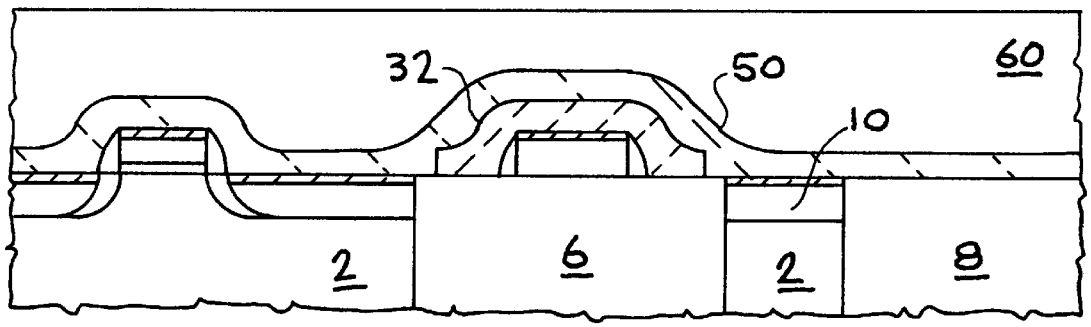
FIG. 15 is a fragmentary vertical cross-sectional view of the structure of FIG. 14 with a planarized insulation layer formed over the structure.
Figure 16:
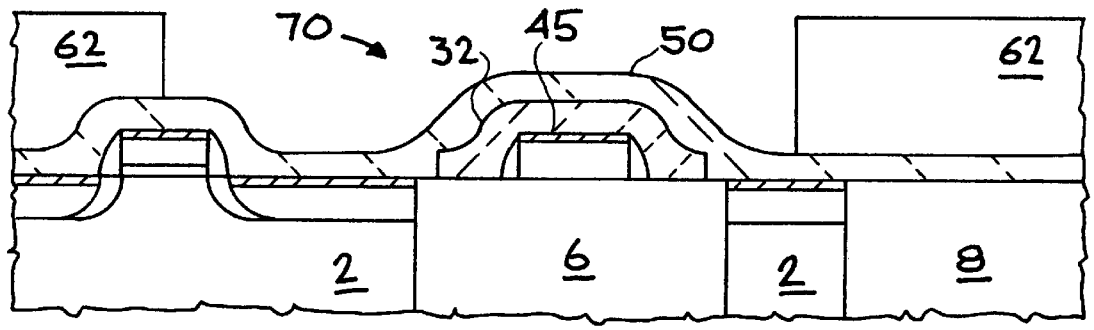
FIG. 16 is a fragmentary vertical cross-sectional view of the structure of FIG. 15 with an opening conforming to the lateral dimensions of the desired local interconnect formed in the insulation layer.
Figure 17:
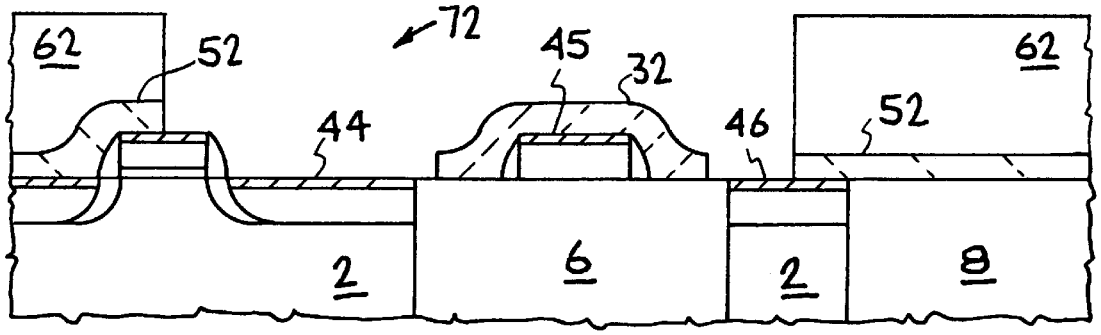
FIG. 17 is a fragmentary vertical cross-sectional view of the structure of FIG. 16 showing an opening cut through the silicon nitride layer conforming to the lateral dimensions of the desired local interconnect.
Figure 18:
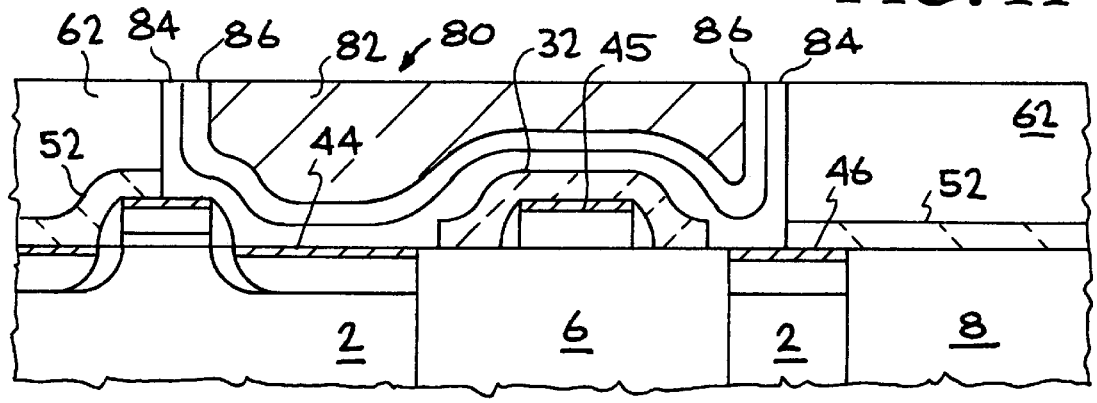
FIG. 18 is a fragmentary vertical cross-sectional view of the structure of FIG. 17 showing the local interconnect formed on the structure.

FIG. 11 illustrates metal silicide contacts 40, 42, 44, and 46 already formed on the structure, as well as a metal silicide portion 45 formed over polysilicon conductive element 14 during the same silicide formation step. Following the metal silicide formation step, oxide layer 30 is blanket deposited over the structure, as shown in FIG. 12, and oxide layer 30 is then patterned to form oxide insulation portion 32 over metal silicide portion 45, as shown in FIG. 13. Silicon nitride etch stop layer 50 is then deposited over the structure, as shown in FIG. 14 (similar to FIG. 5), and dielectric layer 60 is then deposited and planarized as shown in FIG. 15. Dielectric layer 60 is then masked and etched to form opening 70 and to expose a portion of underlying silicon nitride etch stop layer 50, as shown in FIG. 16. This exposed portion of silicon nitride etch stop layer 50 is then etched and removed, as shown in FIG. 17 to form opening 72 (similar to FIG. 8) in which the desired local interconnect will be formed. Blanket deposition of the desired metal layer or metal layers is then carried out and the structure is then planarized, as in the prior embodiment, to form the local interconnect structure 80 illustrated in FIG. 18. Further dielectric and metal interconnect layers may then be formed over the structure, as previously described with respect to the structure shown in FIG. 10.

Thus, a local interconnect of an integrated circuit structure may be formed at the same time as the formation of contact openings and the local interconnect may be formed so as to bridge over one or more conductive elements of the integrated circuit structure. In the preferred embodiment, the formation of the bridging local interconnect may be coordinated with the formation of a silicide mask comprising a patterned oxide layer, to permit formation of metal silicide contacts while masking a conductive silicon element such as a silicon resistor whereby the bridging local interconnect of the invention may be formed without the insertion of an additional masking step into the process. Furthermore, the minimum and maximum thickness of the oxide insulation layer beneath the bridging local interconnect of the invention may be controlled by monitoring other parameters of the process and using the observed values of these other parameters to determine the necessary range of the oxide insulation layer thickness.

Having thus described the invention what is claimed is:

1. An integrated circuit structure formed on a silicon semiconductor substrate and having a local interconnect thereon bridging over a conductive member to electrically connect non-adjacent conductive portions of said integrated circuit structure comprising:
   a) a plurality of active devices formed in said silicon semiconductor substrate, each of said active devices having one or more silicon contact portions comprising non-adjacent conductive portions of said integrated circuit structure;
   b) a silicon oxide region formed in the surface of said silicon semiconductor substrate between two or more of said silicon contact portions;
   c) said conductive member positioned on an upper surface of said silicon oxide region;
   d) a layer of silicon oxide, comprising a metal silicide contact mask which also serves as the sole insulation layer separating said conductive member from said local interconnect to be formed over said layer of silicon oxide, formed directly over said conductive member and in contact with portions of said silicon oxide region on first and second sides of said conductive member;
  e) openings in said layer of silicon oxide in registry with said silicon contact portions to thereby expose one or more of said silicon contact portions on each of said first and second sides of said conductive member;
  f) metal silicide contacts formed on the upper surface of each of said silicon contact portions exposed by said openings in said layer of silicon oxide; and
  g) said local interconnect formed over said layer of silicon oxide and in electrical contact with one or more of said metal silicide contacts on each of said first and second sides of said conductive member;
whereby said layer of silicon oxide, formed with openings therein to permit selecting siliciding of said exposed silicon contact portions, further serves as a sole insulation layer over said conductive member to permit formation of said local interconnect which bridges over said conductive member to thereby permit electrical interconnect of metal silicide contacts respectively formed on said first and second sides of said conductive member.

2. The integrated circuit structure of claim 1 wherein the thickness of said layer of silicon oxide formed over said conductive member ranges from about 11.25 nm to about 40 nm.

3. The integrated circuit structure of claim 1 wherein said structure further comprises:
  a) portions of a silicon nitride layer initially formed over said layer of silicon oxide and said metal silicide portions of said integrated circuit structure;
  b) portions of a planarizable dielectric layer initially formed over said silicon nitride layer; and
  c) said local interconnect is formed in an opening in said silicon nitride layer and said dielectric layer which exposes said underlying metal silicide contacts and said layer of silicon oxide over said conductive member.

4. The integrated circuit structure of claim 3 wherein said dielectric layer is a second silicon oxide ($SiO_2$) layer.

5. The integrated circuit structure of claim 4 wherein the thickness range of said layer of silicon oxide over said conductive member is determined by the formula:

$$(t_{SiN\ overetch} \times r_{SiN\ strip} \times \alpha) + d_{min} \leq d \leq (d_{STI\ loss}/\beta)$$

Where:
  $t_{SiN\ overetch}$=time (seconds) of SiN overetch (time of exposure of layer of silicon oxide to SiN etch);
  $r_{SiN\ strip}$=etch rate of SiN for a particular etchant (nm/sec);
  $\alpha$=ratio of SiN to $SiO_2$ selectivity of SiN etchant;
  $d_{min}$=minimum thickness (nm) of layer of silicon oxide needed for layer of silicon oxide to function satisfactorily as an electrical insulator;
  $d_{STI\ loss}$=thickness (nm) of silicon oxide region lost during etching of layer of silicon oxide;
  $\beta$=etch ratio comprising amount of overetch divided by thickness of layer of silicon oxide.

6. The integrated circuit structure of claim 1 wherein the thickness of said layer of silicon oxide formed over said conductive member ranges from about 20 nm to about 30 nm.

7. The integrated circuit structure of claim 1 wherein said non-adjacent conductive portions further include at least one diffusion region formed in the surface of said silicon semiconductor substrate.

8. The integrated circuit structure of claim 1 wherein said conductive member formed over said silicon oxide region formed in the surface of said silicon semiconductor substrate is a raised conductive member having insulation sidewalls spacers formed on sidewalls on said raised conductive member and over said silicon oxide region, and said layer of silicon oxide is formed over said insulation sidewall spacers.

9. The integrated circuit structure of claim 1 wherein said conductive member has a metal silicide contact formed on the upper surface of said conductive member.

10. An integrated circuit structure on a silicon substrate having a local interconnect which bridges over one or more electrically conductive elements of said integrated circuit structure to electrically interconnect non-adjacent conductive portions which comprises:
  a) an isolation region on said substrate, having formed thereon a conductive element to be bridged by said local interconnect;
  b) a patterned first dielectric layer comprising silicon oxide formed directly over said conductive element and portions of said isolation region, said patterned first dielectric layer having a portion which completely covers said conductive element and having openings therein over spaced apart metal silicide contacts formed in said integrated circuit structure in registry with said openings in said patterned first dielectric layer;
  c) a second dielectric layer formed over said integrated circuit structure;
  d) a portion of said second dielectric layer having an opening therein over:
    i) said portion of said first dielectric layer which covers said conductive element; and
    ii) said openings in said first dielectric layer over said spaced apart metal silicide contacts formed in said integrated circuit structure;
  to thereby expose an upper surface of said portion of said first dielectric layer which covers said conductive element and to expose said spaced apart metal silicide contacts in said integrated circuit structure; and
  e) said local interconnect formed between said spaced apart metal silicide contacts in said opening in said second dielectric layer, said local interconnect bridging over said conductive element and electrically isolated from said conductive element solely by said portion of said first dielectric layer completely covering said conductive element.

11. An integrated circuit structure on a silicon substrate having a local interconnect which bridges over one or more electrically conductive elements of said integrated circuit structure to electrically interconnect non-adjacent conductive portions which comprises:
  a) an isolation region on said substrate, having formed thereon a conductive element to be bridged by said local interconnect;
  b) a patterned first dielectric layer comprising silicon oxide formed directly over said conductive element and portions of said isolation region, said patterned first dielectric layer having a portion which completely covers said conductive element, and having a thickness, over said conductive element, ranging from about 11.25 nm to about 40 nm, and further having openings therein over spaced apart metal silicide contacts formed in said integrated circuit structure in registry with said openings in said patterned first dielectric layer;

c) a second dielectric layer formed over said integrated circuit structure;

d) a portion of said second dielectric layer having an opening therein over:
   i) said portion of said first dielectric layer which covers said conductive element; and
   ii) said openings in said first dielectric layer over said spaced apart metal silicide contacts formed in said integrated circuit structure;

to thereby expose an upper surface of said portion of said first dielectric layer which covers said conductive element and to expose said spaced apart metal silicide contacts in said integrated circuit structure; and e) said local interconnect formed between said spaced apart metal silicide contacts in said opening in said second dielectric layer, said local interconnect bridging over said conductive element and electrically isolated from said conductive element solely by said portion of said first dielectric layer completely covering said conductive element.

* * * * *